United States Patent
Rosso et al.

(10) Patent No.: US 11,774,994 B2
(45) Date of Patent: Oct. 3, 2023

(54) METHOD FOR CURRENT LIMITATION OF A VIRTUAL SYNCHRONOUS MACHINE

(71) Applicant: Wobben Properties GmbH, Aurich (DE)

(72) Inventors: Roberto Rosso, Aurich (DE); Sönke Engelken, Bremen (DE); Marco Liserre, Kiel (DE)

(73) Assignee: Wobben Properties GmbH, Aurich (DE)

( * ) Notice: Subject to any disclaimer, the term of this patent is extended or adjusted under 35 U.S.C. 154(b) by 128 days.

(21) Appl. No.: 17/118,049

(22) Filed: Dec. 10, 2020

(65) Prior Publication Data

US 2021/0173423 A1 Jun. 10, 2021

(30) Foreign Application Priority Data

Dec. 10, 2019 (DE) .................. 102019133823.9

(51) Int. Cl.
  *G05F 1/66* (2006.01)
  *G01R 19/165* (2006.01)
  (Continued)

(52) U.S. Cl.
  CPC ......... *G05F 1/66* (2013.01); *G01R 19/16538* (2013.01); *G01R 27/02* (2013.01);
  (Continued)

(58) Field of Classification Search
  CPC ..... G05F 1/66; G01R 19/16538; G01R 27/02; H02H 9/002; H02J 3/381; H02J 2203/20;
  (Continued)

(56) References Cited

U.S. PATENT DOCUMENTS 9,495,982 B2* 11/2016 Otani ................. H03F 1/523
9,581,656 B2* 2/2017 Halt .................. H02S 50/10
(Continued)

FOREIGN PATENT DOCUMENTS

ES 2724564 A1 * 9/2019
GB 2554954 A 4/2018
WO 2019/129864 7/2019

OTHER PUBLICATIONS

P. Rodriguez, I. Candela, C. Citro, J. Rocabert and A. Luna, "Control of grid-connected power converters based on a virtual admittance control loop," 2013 15th European Conference on Power Electronics and Applications (EPE), 2013, pp. 1-10, doi: 10.1109/EPE.2013.6634621. (Year: 2013).*

(Continued)

*Primary Examiner* — Mohammad Ali
*Assistant Examiner* — Dhruvkumar Patel
(74) *Attorney, Agent, or Firm* — SEED INTELLECTUAL PROPERTY LAW GROUP LLP (57) ABSTRACT

Provided is a control module of a converter, in particular a power converter of a wind power installation, which is configured to control the converter in such a way that the converter emulates a behavior of a synchronous machine, comprising an, in particular internal, control loop which has an, in particular adjustable, virtual admittance by means of which the converter is controlled in order to emulate the behavior of the synchronous machine.

16 Claims, 10 Drawing Sheets (51) Int. Cl.
*G01R 27/02* (2006.01)
*H02H 9/00* (2006.01)
*H02J 3/38* (2006.01)
*H02M 7/44* (2006.01)
*H03H 17/02* (2006.01)
*H03K 5/24* (2006.01)

(52) U.S. Cl.
CPC .............. *H02H 9/002* (2013.01); *H02J 3/381* (2013.01); *H02M 7/44* (2013.01); *H03H 17/0257* (2013.01); *H03K 5/24* (2013.01); *H02J 2203/20* (2020.01); *H02J 2300/28* (2020.01)

(58) Field of Classification Search
CPC .......... H02J 2300/28; H02J 3/38; H02M 7/44; H03H 17/0257; H03K 5/24; H02P 2101/15; H02P 21/0003; Y02E 10/76
See application file for complete search history.

(56) References Cited

U.S. PATENT DOCUMENTS

| | | | | |
|---|---|---|---|---|
| 2011/0031762 A1* | 2/2011 | Letas | ...................... | H02J 3/381 290/55 |
| 2011/0153113 A1* | 6/2011 | Harnefors | ............. | H02M 7/797 700/298 |
| 2012/0292904 A1* | 11/2012 | Tarnowski | ............... | H02J 3/381 290/44 |
| 2014/0049228 A1* | 2/2014 | Rodriguez | ................ | H02P 9/00 322/24 |
| 2014/0049233 A1* | 2/2014 | Rodriguez | ........ | H02M 7/53875 323/234 |
| 2017/0279344 A1* | 9/2017 | Lee | ......................... | H02M 7/06 |
| 2018/0269819 A1* | 9/2018 | Tuckey | ..................... | H02P 9/02 |
| 2019/0148932 A1* | 5/2019 | Benesch | .............. | H02H 11/006 361/85 |

OTHER PUBLICATIONS

Marin et al., "Stability Analysis of a Grid-Connected VSC Controlled by SPC", 7$^{th}$ International Conference on Renewable Energy Research and Applications, Paris, France, Oct. 14-17, 2018, pp. 1209-1214.

Rosso et al., "Robust Stability Analysis of *LCL* Filter Based Synchronverter Under Different Grid Conditions", IEEE Transactions on Power Electronics, vol. 34, No. 6, Jun. 2019, pp. 5842-5853.

Zhang et al., "Start-Up of Virtual Synchronous Machine: Methods and Experimental Comparision", IEEE 2018, 6 pages.

* cited by examiner

METHOD FOR CURRENT LIMITATION OF A VIRTUAL SYNCHRONOUS MACHINE

BACKGROUND

Technical Field

The present invention relates to a control circuit of a converter, in particular a power converter of a wind power installation, which is configured to control the converter in such a way that the converter emulates a behavior of a synchronous machine. The present invention further relates to a controller having a control circuit of this type, a converter having a control circuit of this type, and a method for controlling the same, and a wind power installation having a control circuit of this type and/or carrying out a method of this type

Description of the Related Art

Due to the increasing displacement of conventional, synchronous-generator-driven power stations by renewable, converter-based generators, conventional synchronous generators are increasingly losing influence within the electrical supply network.

This decline in synchronous generators similarly results in a decrease in the conventional flywheels which stabilize the electrical supply network.

Since the effects of such a change within the electrical supply network are virtually unexamined, consideration is being given to operating the converters of the renewable generators in such a way that they act as a synchronous machine on the electrical supply network. In other words, the converters are intended to emulate the behavior of a synchronous machine without losing the benefits of power converter technology. Converters of this type operated in this way are also referred to as a virtual synchronous machine.

In recent years, a wide variety of adjustment methods for synchronous machine emulations have been proposed for this purpose.

Some of these methods, as shown, for example, in R. Rosso, J. Cassoli, G. Buticchi, S. Engelken, and M. Liserre, "Robust stability analysis of LCL filter based synchronverter under different grid conditions," IEEE Trans. Power Electron., 2018, doi: 10.11 09/TPEL.2018.2867040, even offer advantages compared with standard established converter adjustment methods, particularly on "weak" networks, i.e., networks having a low short circuit power, for example a short circuit ratio (SCR)<4.

The disadvantage of hitherto known methods for emulating a synchronous machine by means of a converter is that said synchronous machine is not designed for any network faults occurring in the electrical supply network.

BRIEF SUMMARY

An adjustment method is proposed for dealing with network faults for virtual synchronous machines, preferably in order to be able to continue to reproduce the characteristics of a real synchronous machine even in the event of a network fault and subject to the constraints of the hardware characteristics of the converter.

A control circuit of a converter, in particular a power converter of a wind power installation, is therefore proposed which is configured to control the converter in such a way that the converter emulates a behavior of a synchronous machine, comprising an, in particular internal, control loop which has an, in particular adjustable, virtual admittance by means of which the converter is controlled in order to emulate the behavior of the synchronous machine.

The control circuit is therefore configured to operate the converter as a virtual synchronous machine, in particular so that the converter appears statically and dynamically as a synchronous machine on an electrical supply network.

Insofar as virtual values are mentioned below, such as, for example, virtual back electromotive force, this is to be understood to mean, in particular, the values which correspond to the values of a normal synchronous machine in the converter control. The converter is controlled, in particular, via or by means of a virtual admittance controller which is used, for example, in an internal control loop, preferably a current control loop.

The control loop comprises, for example, a voltage matching between a network voltage measured at the connection point of the converter and the virtual back electromotive force of the virtual synchronous machine, the result of which is fed via the virtual admittance in order to generate a current setpoint for the converter.

Through the use of a virtual admittance, it is possible, in particular, to adjust the current amplitudes of the virtual synchronous machine, particularly in such a way that the current amplitude generated by the virtual synchronous machine in the event of a network fault does not exceed the constraints of the converter hardware.

The underlying assumption here is that, in the emulation, precisely as in a real synchronous machine, substantially excessive (current) amplitudes can occur during a network fault which have a multiple of the nominal value of the stator current. However, a behavior of this type could only be reproduced if the converter was correspondingly overdimensioned for these currents.

As provided herein, these currents are adjusted by means of a virtual admittance.

In one particularly preferred embodiment, the virtual admittance is adjustable, for example by means of an admittance adjustment circuit, i.e., the value of the virtual admittance can be modified in live operation, and can be adapted, in particular, to any network and/or hardware requirements.

It is furthermore particularly advantageous with the use of a virtual admittance not only that the behavior of a voltage source can be reproduced, but also that the control of the converter currents is guaranteed.

The virtual admittance is preferably defined as:

$$Y_s(S) = \frac{1}{Z_{virt}(S)} = \frac{1}{R_{virt} + sL_{virt}},$$

where $Z_{virt}(S)$ is a virtual impedance and $R_{virt}$ is a corresponding ohmic part of the virtual impedance and $L_{virt}$ is a corresponding inductive part of the virtual impedance and s is a Laplace operator.

As a result, it is possible, in particular, to control both the real component and the imaginary component of the current, for example by predefining an ohmic part $R_{virt}$ and/or by predefining an inductive part $L_{virt}$ of the virtual admittance $Y_S(S)$.

Both the ohmic part $R_{virt}$ and the inductive part $L_{virt}$ are preferably modifiable in live operation, for example by means of an admittance adjustment circuit which is configured to modify the virtual admittance $Y_S(S)$, in particular by means of specific values $R_{virt\_f}$, $L_{virt\_f}$ which are calculated for the ohmic part $R_{virt}$ and for the inductive part $L_{virt}$.

The virtual admittance $Y_S(S)$ preferably generates a first current setpoint i*.

It is therefore proposed, in particular, that the virtual admittance forms part of a current control loop which is preferably used to generate a current setpoint for the converter.

Furthermore the, in particular internal, control loop preferably has a comparator (voltage matching) which forms a difference between a virtual back electromotive force e* and a voltage $V_{PCC}$ measured at the connection point of the converter, and feeds the difference to the virtual admittance $Y_S(S)$.

The virtual admittance controller therefore generates a current setpoint from a voltage value.

The voltage value is preferably made up of a difference between a virtual back electromotive force e* and a voltage $V_{PCC}$ measured at the connection point of the converter.

The virtual back electromotive force e* can be provided, for example, by an external control loop, in particular an external control loop as described below.

The external control loop is preferably configured to emulate a virtual synchronous machine, in particular to predefine or generate a virtual back electromotive force.

The voltage $V_{PCC}$ measured at the connection point of the converter can be obtained, for example, by means of a voltage measurement which is configured, for example, to measure the voltages of the three output phases of the converter. The voltage measurement can, for example, form part of the converter.

The current setpoint generated by the virtual admittance controller can then be used, for example, to control the converter, in particular the, preferably three, three-phase AC currents generated by the converter.

Furthermore, a current measurement is preferably used which is configured to measure a current generated by the converter, in particular the current $i_g$ described below. The converter can be additionally adjusted by means of this measured current.

Furthermore, the, in particular internal, control loop preferably has a current comparator which is configured to generate a control value S from a first or a second current setpoint i*, i** and a current $i_g$ generated by the converter.

The control loop therefore further comprises an, in particular further, matching which matches the current setpoint i*, i** with a current $i_g$ generated by the converter in order to generate a control value S by means of which the converter is controlled.

This matching can also be referred to as current control.

If, for example, the current setpoint i*, i** is greater than the current $i_g$ generated by the converter, the control value S increases the current $i_g$ generated by the converter, in particular in such a way that the difference between the current setpoint i*, i** and the current $i_g$ generated by the converter becomes zero.

If, for example, the current setpoint i*, i** is less than the current $i_g$ generated by the converter, the control value S reduces the current $i_g$ generated by the converter, in particular in such a way that the difference between the current setpoint i*, i** and the current $i_g$ generated by the converter becomes zero.

Furthermore, the, in particular internal, control loop preferably has a current limiter, in particular comprising an amplitude limiter and/or current amplitude limiter which limits a first current setpoint i* to a second current setpoint i**.

Furthermore, it is therefore also proposed that the control circuit has a current limiter.

The limiter is used, in particular, to limit the current generated by the converter, particularly in its amplitude.

For this purpose, for example, the first current setpoint is split by means of a transformer, for example a dq transformer, into an angle and into an amplitude and is then limited in amplitude.

This is particularly advantageous if, for example, the external control loop or the internal control loop produces a current which is greater than an, in particular hardware, constraint of the converter. In such cases, the current limiter therefore limits the first current setpoint i* generated by the internal control loop to a second current setpoint i**.

In one preferred embodiment, the current limiter is parameterizable and/or adjustable in live operation, in particular to a maximum permissible current value which produces a current corresponding to the second current setpoint i**.

Furthermore, the current limiter preferably has a transformer, in particular a dq transformer or an αβ transformer which splits the first current setpoint i* into an amplitude $I_{amp}$ and an angle $I_{phase}$, in particular in order to limit the current setpoint i* in amplitude, or a transformer which splits the first current setpoint (i*) into positive-sequence and negative-sequence components, in particular in order to limit the current setpoint (i*) in amplitude.

It is therefore proposed, in particular, to limit not only the instantaneous or present value of the first current setpoint i*, but also the amplitude of the space vector.

This can be done, for example, by means of a transformer into αβ coordinates and/or a split by means of the symmetrical components method.

It is particularly advantageous here that a higher precision of the limitation can be achieved by means of the transformer, with a simultaneously smaller technical adjustment intervention, in particular since the angle preferably remains unaffected by the limitation.

In one preferred embodiment, only the amplitude, and not the angle or the phase, is therefore limited.

Furthermore, the current limiter preferably has a back transformer which is configured to form a second current setpoint (i**) from an or the amplitude $I_{amp}$ and an or the angle $I_{phase}$.

It is therefore also proposed, in particular, to generate the second current setpoint i** from the limited amplitude $I_{amp}$ and the angle $I_{phase}$ by means of a back transformer.

In one particular embodiment, the back transformer has the same transformer type, such as, for example, dq transformer or αβ transformer, as the transformer.

Furthermore, the current limiter preferably has a signal input which is configured to receive a frequency or an angle signal of a further, in particular external, control loop.

It is therefore proposed, in particular, that the current limiter operates with an internal reference, for example the reference angle ⊖ described below, in particular in order to determine a correct phase position for the current setpoint, in particular the second current setpoint i**, particularly in the event of a network fault.

The reference angle ⊖ which is calculated from the external control loop is used, for example, for the conversion of the current setpoints i*, i** from abc coordinates onto dq or αβ coordinates, in particular in order to calculate the amplitude and phase of the space vector.

The current limiter preferably has a component splitter which is configured to split an or the amplitude $I_{amp}$ and furthermore or alternatively an or the angle $I_{phase}$ into a positive-sequence system and into negative-sequence system, in particular by means of an internal reference angle ⊖.

It is therefore also proposed, in particular, that the limitation operates in the positive-sequence and negative-sequence system.

It is particularly advantageous here that the current limiter can be used in the event of asymmetric network faults also.

Furthermore, the current limiter preferably has a component combiner which is configured to form a second current setpoint i** from a or the positive-sequence system value and furthermore or alternatively a or the negative-sequence system value of an or the amplitude $I_{amp}$ and furthermore or alternatively an or the angle $I_{phase}$.

It is therefore also proposed, in particular, to split the first current setpoint i* into positive-sequence and negative-sequence components, to limit the amplitude and back-transform the resulting system once more into the second current setpoint i**.

Furthermore, the, in particular internal, control loop preferably has an admittance adjustment circuit, in particular for limiting the converter currents, which is configured to modify the virtual admittance $Y_S(S)$.

The admittance adjustment circuit is configured, for example, to calculate values for the ohmic part $R_{virt}$ and for the inductive part $L_{virt}$ and to adjust the virtual admittance by means thereof.

The currents generated by the converter, for example, particularly in the event of a network fault, can be reduced, and can preferably be limited to a permissible value, by increasing the virtual admittance $Y_S(S)$.

Furthermore, the admittance adjustment circuit preferably has a comparator, comprising: a manipulated variable s1 for the ohmic part $R_{virt}$ of the virtual admittance $Y_S(S)$ and furthermore or alternatively a manipulated variable s2 for the inductive part $L_{virt}$ of the virtual admittance $Y_S(S)$, wherein the manipulated variable s1, s2 is adjustable, and wherein the comparator is configured to compare the manipulated variable s1, s2 with a calculated value $R_{virt\_f}$ for the ohmic part $R_{virt}$ of the virtual admittance $Y_S(S)$ and furthermore or alternatively with a calculated value $L_{virt\_f}$ for the inductive part $L_{virt}$ of the virtual admittance $Y_S(S)$.

It is therefore proposed, in particular, that the ohmic part $R_{virt}$ and the inductive part $L_{virt}$ of the virtual admittance $Y_S(S)$ are set via a comparison.

The admittance adjustment circuit comprises, for example, an admittance computer for calculating an ohmic part $R_{virt\_f}$ and an inductive part $L_{virt\_f}$.

The values $R_{virt\_f}$, $L_{virt\_f}$ calculated in this way are then matched in each case with a manipulated variable s1 for the ohmic part $R_{virt}$ and a manipulated variable s2 for the inductive part $L_{virt}$.

If, for example, the calculated value of the inductive part $L_{virt\_f}$ is greater than the set manipulated variable s2 for the inductive part $L_{virt}$, the calculated value of the inductive part $L_{virt\_f}$ is used for the virtual admittance $Y_S(S)$.

If, for example, the calculated value of the ohmic part $R_{virt\_f}$ is less than the set manipulated variable s1 for the ohmic part $R_{virt}$, the manipulated variable s1 is used for the virtual admittance $Y_S(S)$.

Furthermore, the admittance adjustment circuit further has a filter, preferably a Kalman filter, which is configured to estimate a network voltage amplitude $V_{PCC\_amp}$, in particular of a voltage $V_{PCC}$ measured at the connection point of the converter, and furthermore or alternatively an integrator, preferably a second-order generalized integrator, which is configured to estimate a network voltage amplitude $V_{PCC\_amp}$, in particular of a voltage $V_{PCC}$ measured at the connection point of the converter.

It is therefore proposed, in particular, that the admittance adjustment circuit operates on the basis of the network voltage amplitude $V_{PCC\_amp}$ which is determined, for example, by means of a Kalman filter from the voltage $V_{PCC}$ measured at the connection point of the converter.

The admittance adjustment circuit can have, for example, an admittance computer, for this purpose.

The admittance adjustment circuit preferably has an admittance computer which is configured to determine a calculated value $R_{virt\_f}$ for the ohmic part $R_{virt}$ of the virtual admittance $Y_S(S)$ and furthermore or alternatively a calculated value $L_{virt\_f}$ for the inductive part $L_{virt}$ of the virtual admittance $Y_S(S)$, in particular using a maximum permissible current $I_{max}$ and/or an estimated network voltage amplitude $V_{PCC\_amp}$ and/or amplitude value corresponding in particular to a value of the amplitude of the virtual back electromotive force.

A control unit (controller) of a converter, in particular a power converter of a wind power installation, is further proposed, said control unit being configured to control the converter in such a way that the converter emulates a behavior of a synchronous machine, comprising: an, in particular external, control loop for generating an internal reference angle ⊖ and/or a virtual back electromotive force e*, having at least: a switch which is configured to be closed or opened in the event of a network fault in an electrical supply network, in particular in order to provide a space vector having a constant amplitude and a constant phase angle.

The control unit thus has at least one switch which changes position as soon as a fault is detected, in such a way that a virtual back electromotive force of the virtual synchronous machine is made available in a space vector having a constant amplitude and phase angle.

This virtual back electromotive force can then serve, for example, as the back electromotive force e*, in particular for a control circuit described above or below, in particular for an or the internal control loop.

The space vector is preferably used as an input signal of a control circuit which generates a control value in order to control the converter.

The control circuit is preferably a control circuit described above or below.

A method for controlling a converter, in particular a wind power installation, is further proposed, comprising the steps of: measuring a voltage $V_{PCC}$ at a connection point of the converter, predefining a virtual back electromotive force e*, predefining a virtual admittance $Y_S(S)$, calculating a control value S, in particular a current control value, depending on the voltage $V_{PCC}$ measured at the connection point of the converter, the virtual back electromotive force e* and the virtual admittance $Y_S(S)$, and controlling the converter depending on the control value S.

The control value S is preferably calculated from a current setpoint i*, i**, wherein the method further comprises the step of: limiting the current setpoint i* with a current limiter.

This is preferably done using a control circuit described above or below or a control unit described above or below.

A converter, in particular of a wind power installation, is further proposed, comprising at least one control unit, in particular as described above or below, wherein the control unit is configured to control the converter using a virtual admittance in such a way that the converter emulates at least one behavior of a synchronous machine.

In one preferred embodiment, the converter is designed as an inverter and is configured to feed a three-phase current into a three-phase network, for example a wind farm network or an electrical supply network.

The converter can further be designed as modularized, i.e., as a plurality of parallel converter modules and/or inverter modules.

The converter is preferably a converter of a renewable generator, such as, for example, a wind power or PV installation, or an energy store or an FACTS, in particular STATCOM or UPFC, which is configured to feed a three-phase current into an electrical network.

A wind power installation is further proposed, comprising a control circuit described above or below and/or a control unit described above or below and/or a converter described above or below and/or comprising a control unit of a converter which is configured to carry out a method described above or below.

BRIEF DESCRIPTION OF THE SEVERAL VIEWS OF THE DRAWINGS

The present invention will now be described in detail below by way of example on the basis of example embodiments with reference to the accompanying figures, wherein the same reference numbers are used for identical or similar assemblies.

DETAILED DESCRIPTION

Figure 1:
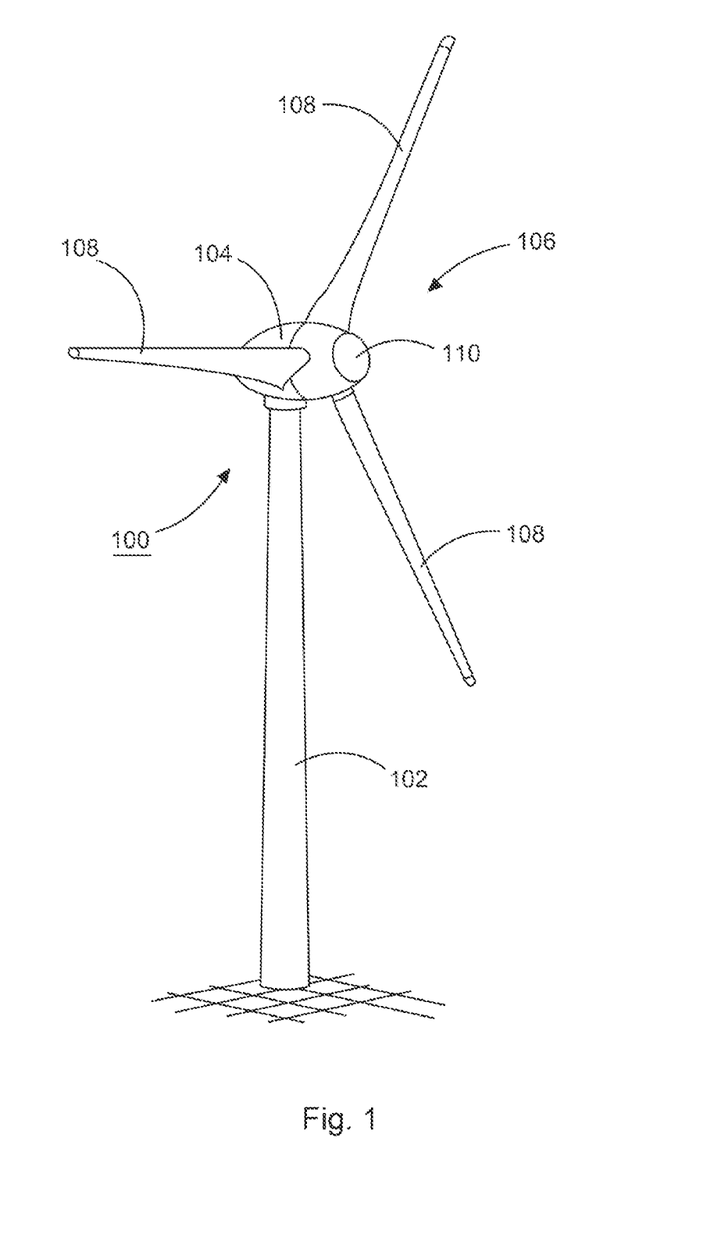
FIG. 1 shows a schematic view of a wind power installation according to one embodiment.

FIG. 1 shows a schematic view of a wind power installation 100 according to one embodiment.

The wind power installation 100 has a tower 102 and a nacelle 104 for this purpose. An aerodynamic rotor 106 with three rotor blades 108 and a spinner 110 is disposed on the nacelle 104. The rotor 106 is set in rotational motion by the wind during operation and thereby drives a generator in the nacelle 104.

The generator is connected by means of a converter to an electrical network, for example a wind farm network or an electrical supply network, in order to feed in a three-phase AC current.

For this purpose, the wind power installation comprises a control circuit described above or below and/or a control unit described above or below and/or a converter described above or below and/or a control unit of a converter which is configured to carry out a method described above or below.

Figure 2:
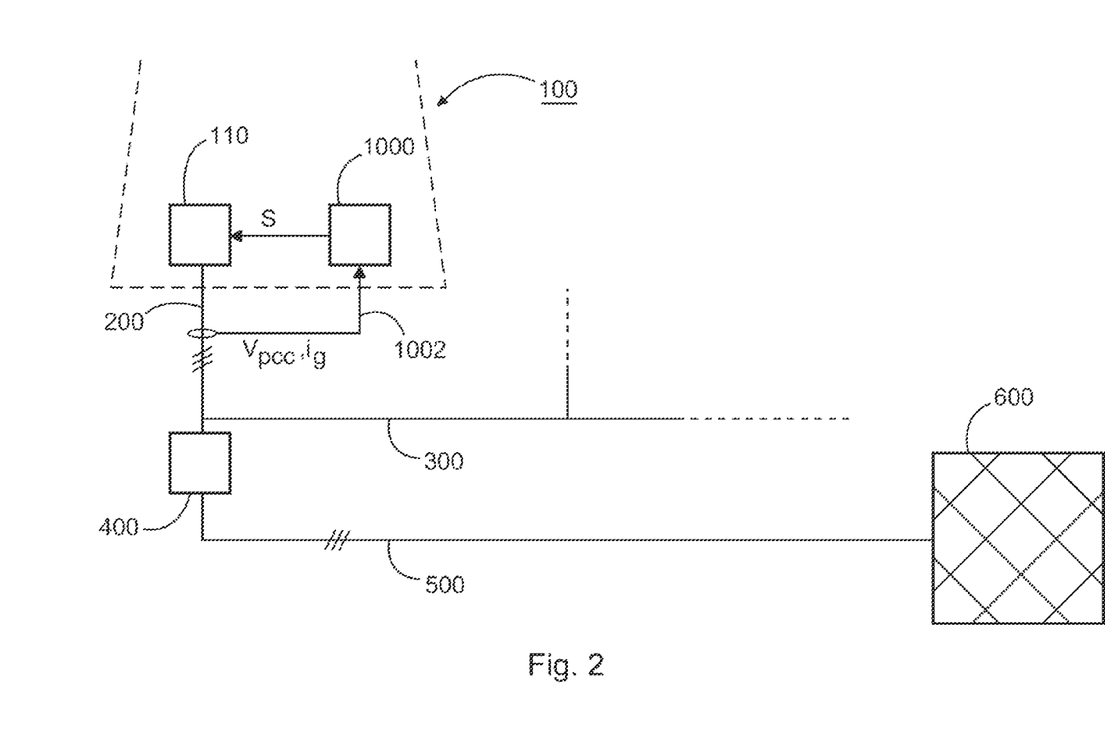
FIG. 2 shows a schematic view of a wind power installation at a connection point according to one embodiment.

FIG. 2 shows a schematic view of a wind power installation 100 at a connection point 200 according to one embodiment.

The wind power installation 100 has an inverter 110 and a control unit (controller) 1000.

The control unit 1000 is configured to carry out a method described above or below and, in particular, to control the inverter 110 by means of the control value S in such a way that said inverter 110 emulates a synchronous machine.

To do this, the control unit 1000 has, inter alia, a voltage measurement and/or current measurement 1002 which is configured to measure a first voltage of a first phase, a second voltage of a second phase and a third voltage of a third phase, in particular the three phases of the wind farm network 300 and/or the current $i_g$ generated by the converter.

The current $i_g$ generated by the inverter 110 is fed at the connection point PCC, for example into a wind farm network 300 which interconnects a plurality of wind power installations.

The wind farm network 300 is further connected via a transformer 400 and a connection line 500 to an electrical supply network 600.

Figure 3:
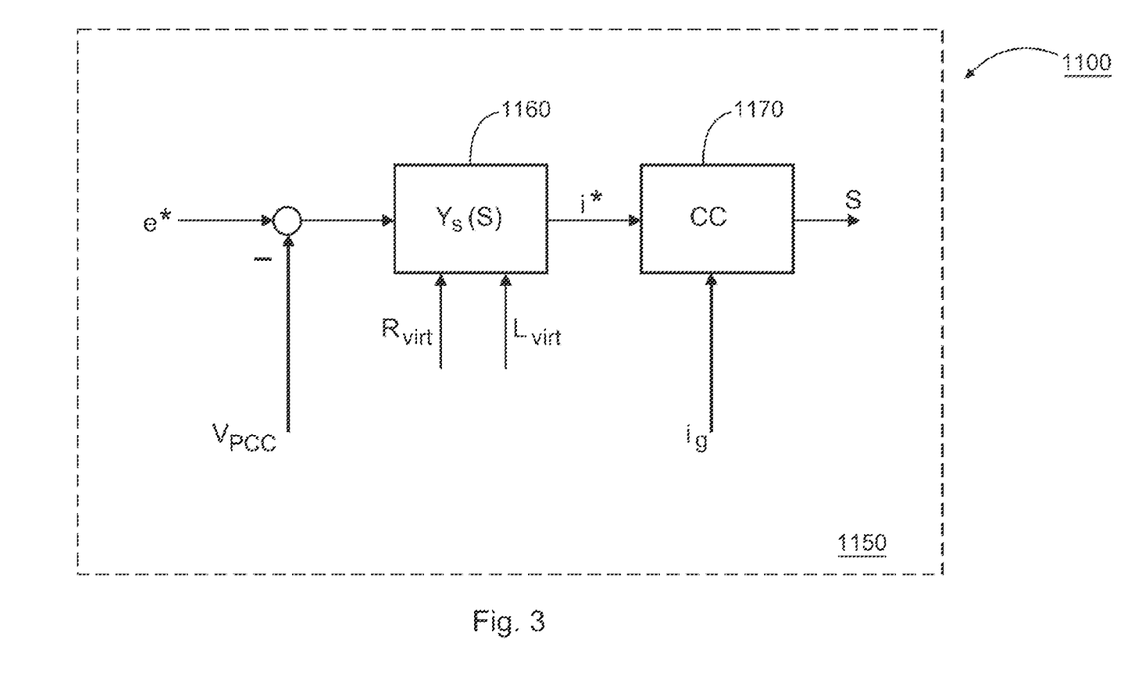
FIG. 3 shows a control circuit of a converter according to one embodiment.

FIG. 3 shows a control circuit 1100 of a inverter 110 according to one embodiment. The control circuit 1100 may be part of the controller 1000.

The control circuit 1100 comprises an internal control loop 1150 which has an adjustable virtual admittance controller 1160 by means of which the converter is controlled in order to emulate the behavior of the synchronous machine.

The virtual admittance controller 1160, which can also be referred to as $Y_S(S)$, is defined as:

$$Y_s(S) = \frac{1}{Z_{virt}(S)} = \frac{1}{R_{virt} + sL_{virt}},$$

where $Z_{virt}(S)$ is a virtual impedance and $R_{virt}$ is a corresponding ohmic part of the virtual impedance and $L_{virt}$ is a corresponding inductive part of the virtual impedance and s is a Laplace operator.

The virtual admittance is preferably adjusted by means of the ohmic part of the virtual impedance $R_{virt}$ and/or the inductive part of the virtual impedance $L_{virt}$ in live operation of the converter, in particular as described above or below.

The virtual admittance controller 1160 forms a first current setpoint i* by means of a comparator or subtractor from a difference between a virtual back electromotive force e* and a voltage $V_{PCC}$ measured at the connection point of the converter.

This current setpoint i* is converted by means of a current comparator 1170 into a control value S, in particular in order to control the converter.

The current comparator 1170 is therefore configured, in particular, to generate a control value S from a first current setpoint i* and a current $i_g$ generated by the converter, for example in or by means of abc coordinates $i^*_a$, $i^*_b$, $i^*_c$.

The current comparator 1170 compares, in particular, the current setpoint i* with a current $i_g$ generated by the converter in order to generate a control value S by means of which the converter is controlled. The current $i_g$ can be generated, for example with a hysteresis adjustment method, for example by means of abc coordinates which are used to control the pulses of the IGBT of the converter.

Figure 4:
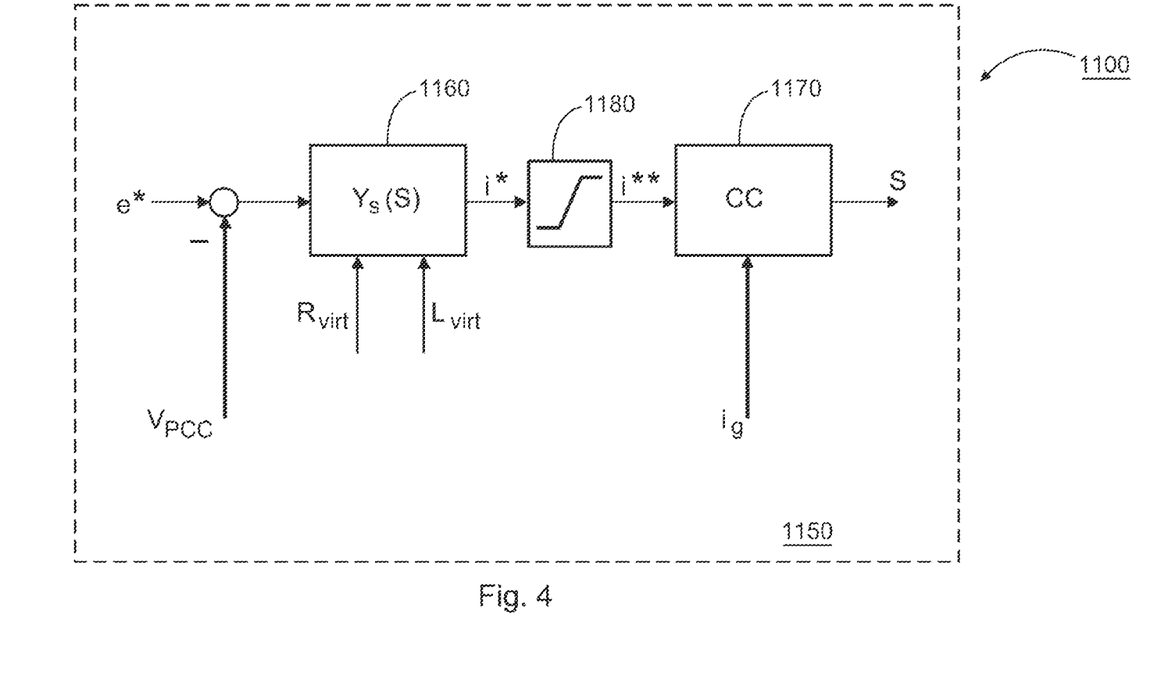
FIG. 4 shows a control circuit of a converter according to a further embodiment with a current limiter.

FIG. 4 shows a control circuit 1100 of a converter, in particular as shown in FIG. 3, according to a further embodiment with a current limiter 1180.

The control circuit 1100 has a current limiter 1180 which is disposed between the virtual admittance controller 1160 and the current comparator 1170 in the internal control loop 1150.

The current limiter is therefore similarly part of the internal control loop and is preferably configured to limit the first current setpoint i* which is generated by the virtual admittance controller 1160 to a second current setpoint i**, for example by predefining a current maximum and/or a current minimum for the current setpoint i*.

The current comparator 1170 is therefore also configured to generate a or the control value S from a second current setpoint i** and a current $i_g$ generated by the converter.

Figure 5:
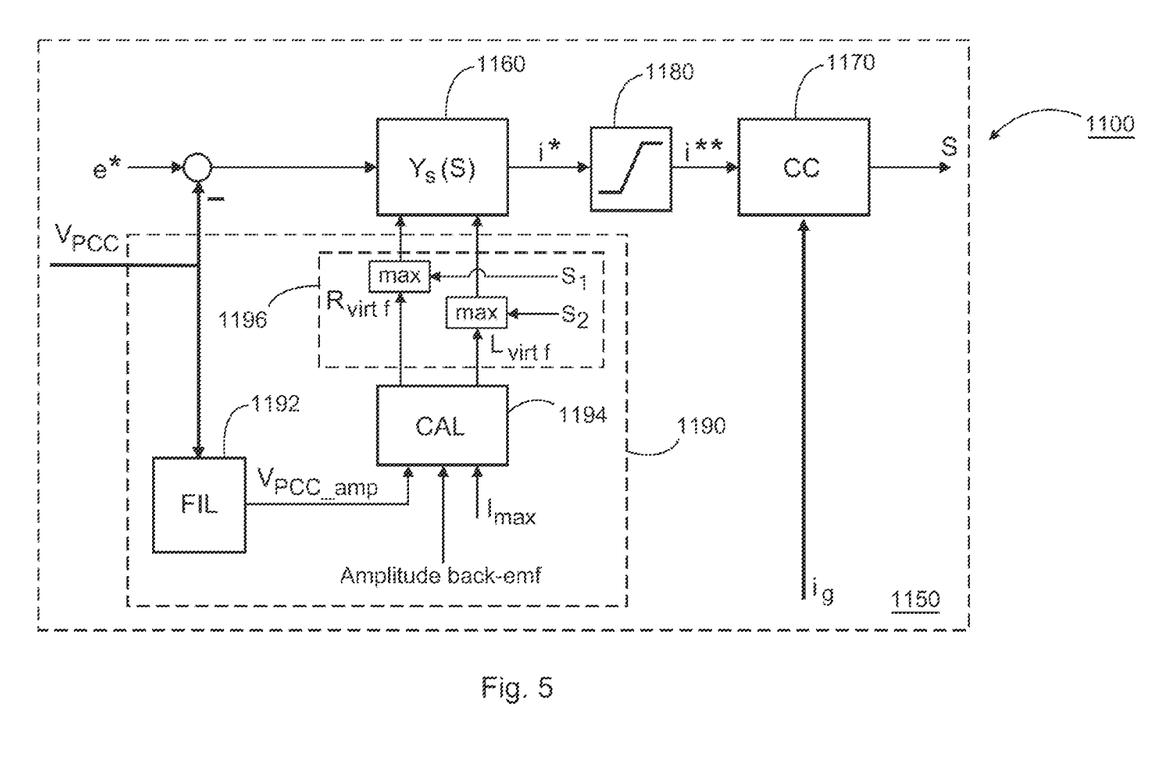
FIG. 5 shows a control circuit of a converter according to one preferred embodiment with an admittance adjustment circuit.

FIG. 5 shows a control circuit 1100 of a converter, in particular as shown in FIG. 4, according to a further embodiment with admittance adjustment circuit, controller or adjustor 1190.

The control circuit 1100 further has an admittance adjustment circuit 1190 which is configured to modify or adjust the virtual admittance $Y_S(S)$ in the internal control loop 1150.

The admittance $Y_S(S)$ can, in particular, be increased by means of the admittance adjustment circuit 1190 in order to limit the converter currents.

For this purpose, the admittance adjustment circuit 1190 comprises a filter block and/or integrator block 1192 which is configured to filter and/or estimate the voltage $V_{PCC}$ measured at the connection point.

The filter block and/or integrator block 1192 preferably has a Kalman filter for this purpose which is configured to estimate a network voltage amplitude $V_{PCC\_amp}$, in particular of a voltage $V_{PCC}$, measured at the connection point of the converter.

Additionally or alternatively, the filter block and/or integrator block 1192 preferably has an integrator, preferably a second-order generalized integrator, which is configured to estimate a network voltage amplitude $V_{PCC\_amp}$, in particular of a voltage $V_{PCC}$, measured at the connection point of the converter.

The network voltage amplitude $V_{PCC\_amp}$ determined by means of the filter block and/or integrator block 1192 is fed to an admittance computer (processor) 1194.

The admittance computer 1194 is configured to determine a calculated value $R_{virt\_f}$ for the ohmic part $R_{virt}$ of the virtual admittance $Y_S(S)$ and furthermore or alternatively a calculated value $L_{virt\_f}$ for the inductive part $L_{virt}$ of the virtual admittance $Y_S(S)$, in particular using a maximum permissible current $I_{max}$ and/or an estimated network voltage amplitude $V_{PCC\_amp}$ and/or a further amplitude value corresponding, in particular, to the virtual back electromotive force (virtual back-emf).

The values $R_{virt\_f}$, $L_{virt\_f}$ thus calculated are transferred to a comparator.

The comparator 1196 comprises a manipulated variable s1 for the ohmic part $R_{virt}$ of the virtual admittance $Y_S(S)$ and furthermore a manipulated variable s2 for the inductive part $L_{virt}$ of the virtual admittance $Y_S(S)$, wherein the manipulated variables s1, s2 are preferably adjustable.

The comparator is further configured to compare the manipulated variables s1, s2 with the calculated value $R_{virt\_f}$ for the ohmic part $R_{virt}$ of the virtual admittance $Y_S(S)$ and further with the calculated value $L_{virt\_f}$ for the inductive part $L_{virt}$ of the virtual admittance $Y_S(S)$.

The result of this comparison is then used to adjust the virtual admittance $Y_S(S)$ according to the following equation:

$$Y_s(S) = \frac{1}{Z_{virt}(S)} = \frac{1}{R_{virt} + sL_{virt}}.$$

It is therefore proposed, in particular, to predefine the values of the ohmic part $R_{virt}$ and the inductive part $L_{virt}$ in live operation.

An additional block, the admittance adjustment circuit 1190, is further proposed which calculates the instantaneous values for the respective parts of the virtual impedance, i.e., for the ohmic part $R_{virt\_f}$ and for the inductive part $L_{virt\_f}$, on the basis of the instantaneous value of the voltage amplitude $V_{PCC\_amp}$, the amplitude of the back electromotive force and the maximum amplitude of the converter current $I_{max}$, in particular for the limitation of the currents. These values are denoted in FIG. 5 as $R_{virt\_f}$ and $L_{virt\_f}$, and correspond in normal operation to relatively small values which become relevant for calculating the virtual impedance only at the time when a fault has been detected and their amplitudes exceed those of the nominal values $R_{virt}$ and $L_{virt}$.

Figure 6:
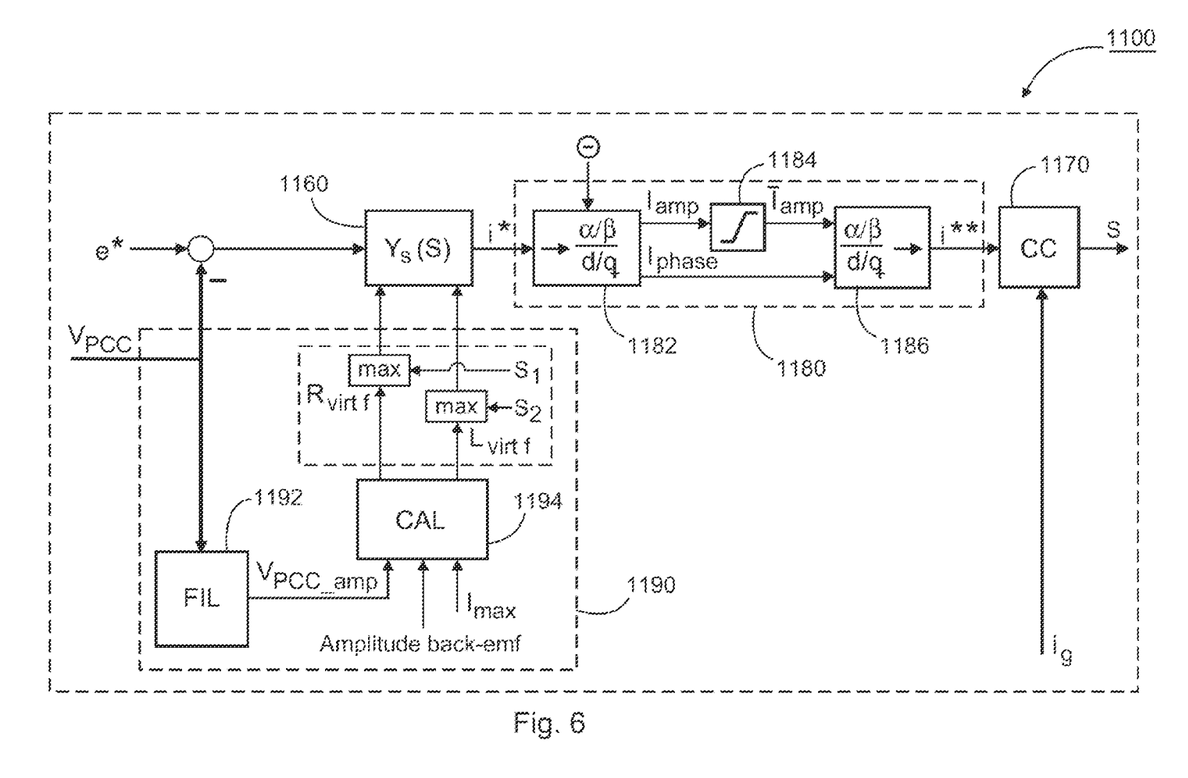
FIG. 6 shows a control circuit of a converter according to one preferred embodiment with a further current limiter.

FIG. 6 shows a control circuit 1100 of a converter, in particular as shown in FIG. 5, according to a further embodiment with a further current limiter 1180.

The current limiter 1180 comprises a transformer or processor 1182, an amplitude limiter 1184 and a back transformer or processor 1186.

The transformer 1182 is, for example, a dq transformer or an αβ transformer, which is configured to split a or the current setpoint i* into an amplitude $I_{amp}$ and an angle $I_{phase}$, in particular in order to limit the current setpoint i* in amplitude.

The actual limitation of the amplitude $I_{amp}$ is then performed by means of the amplitude limiter 1184, which can also be referred to as current amplitude limiter.

The amplitude limiter 1184 thus limits the amplitude $I_{amp}$ of the first current setpoint i* to a maximum permissible amplitude $I_{amp}$.

The angle $I_{phase}$ and the maximum permissible amplitude $I_{amp}$ are then transformed by means of the back transformer 1186 into a second current setpoint i**.

The second current setpoint i** is then fed to the current comparator CC.

Figure 8:
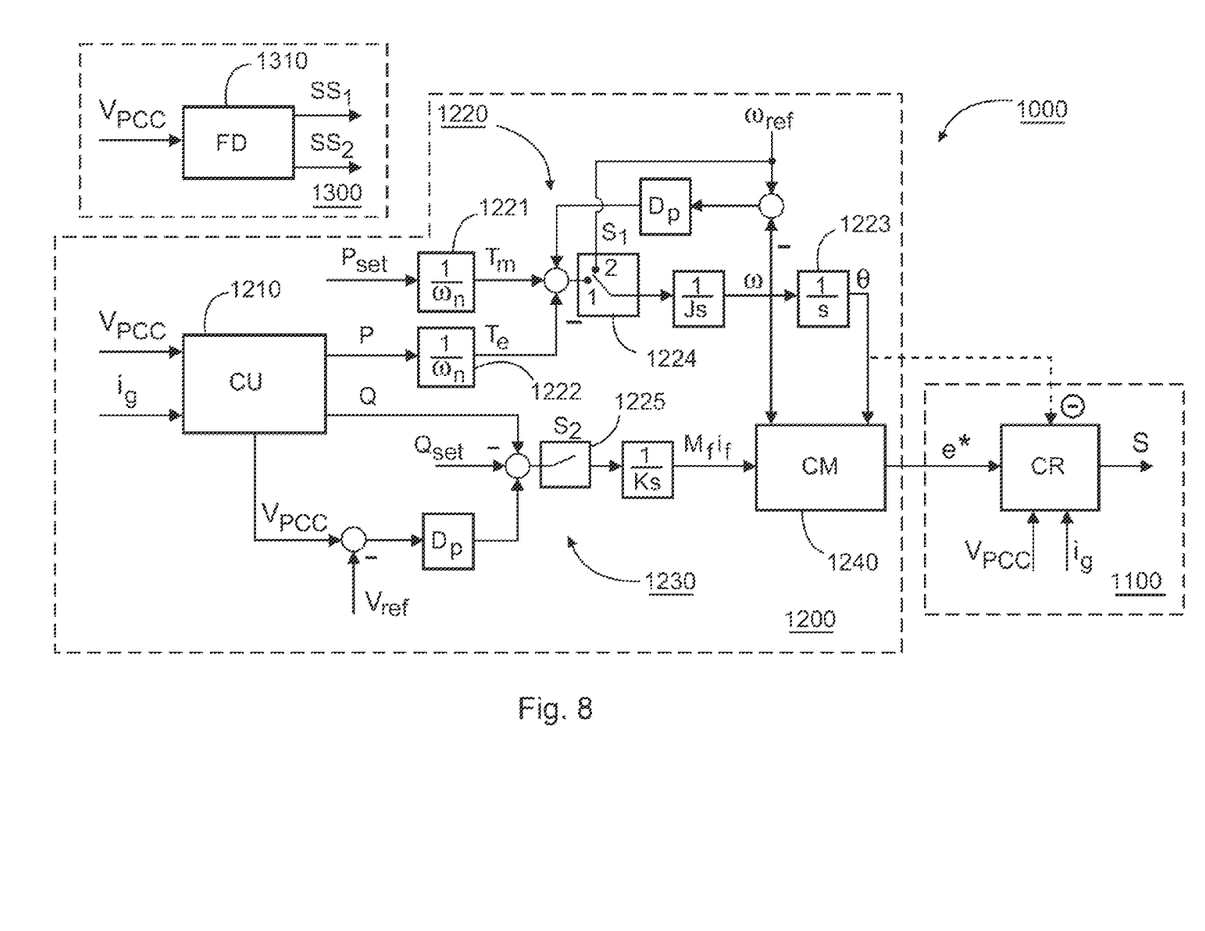
FIG. 8 shows a control unit of a converter in one preferred embodiment.

An internal reference angle ⊖ which is calculated, for example, by means of an external control loop, as shown, for example, in FIG. 8, is further used for optimization.

The internal reference angle ⊖ is used, in particular, in the transformation, in particular in order to obtain a more precise amplitude and a more precise angle in the transformation.

Figure 7A:
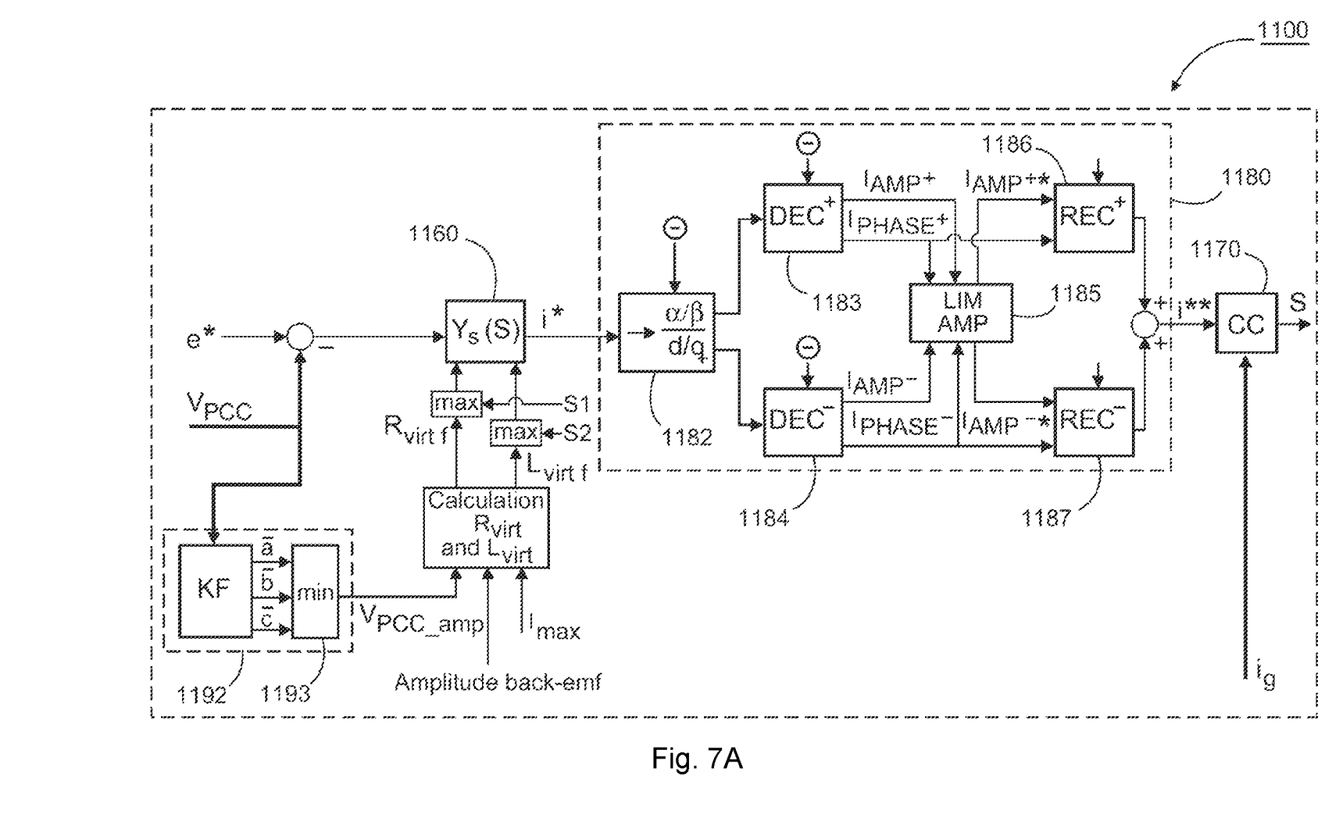
FIG. 7A shows a control circuit of a converter according to one preferred embodiment with a preferred current limiter, in particular for asymmetric network faults.

FIG. 7A shows a preferred example embodiment of a control circuit of a converter, in particular as in FIG. 6, according to a further embodiment with a preferred current limiter, in particular for asymmetric network faults.

If asymmetric network faults occur, the converter may become asymmetrically loaded as a result. This in turn causes each phase to have a different current amplitude.

In order to limit different amplitudes of different phases in a targeted manner, it is therefore proposed to cause the filter block and/or integrator block 1192 to operate with phase precision.

For this purpose, the filter block and/or integrator block 1192 has a Kalman filter KF which estimates the individual amplitudes of the voltages of the phases a, b, c.

The values thus estimated are compared by means of a comparison operator (comparator) 1193, wherein the lowest instantaneous value is then used to calculate the virtual admittance $Y_S(S)$, in particular as described above or below.

Along with the transformer 1182 which performs a transformation into a positive-sequence and negative-sequence system, for example by means of an αβ transformation, the current limiter 1180 further comprises a splitter for the positive-sequence system 1183, a splitter for the negative-sequence system 1184, an amplitude limiter 1185, a reconstruction for the positive-sequence system 1186 and a reconstruction for the negative-sequence system 1184.

It is therefore proposed, in particular, to split both the amplitude and the angle by means of the splitters 1183, 1184 into positive-sequence and negative-sequence components, then to limit the amplitude by means of the amplitude limiter 1185 and then to convert the components obtained therefrom by means of the reconstructions 1186, 1187 into the second current setpoint i**.

The splitting preferably produces a current amplitude of the positive-sequence system $I_{AMP}^+$, a current amplitude of the negative-sequence system $I_{AMP}^-$, a phase angle of the positive-sequence system $I_{PHASE}^+$ and a phase angle of the negative-sequence system $I_{PHASE}^-$.

The second current setpoint i** is then fed to the current comparator CC.

The reference angle ⊖ which is calculated, for example, by means of an external control loop, as shown, for example, in FIG. 8, is also taken into account in the splitting into the positive-sequence and negative-sequence system.

It is particularly advantageous here that the same internal reference angle is used in both the transformation and the splitting, as a result of which no synchronization unit is necessary between the transformer 1182 and the splitters 1183, 1184.

Figure 7B:
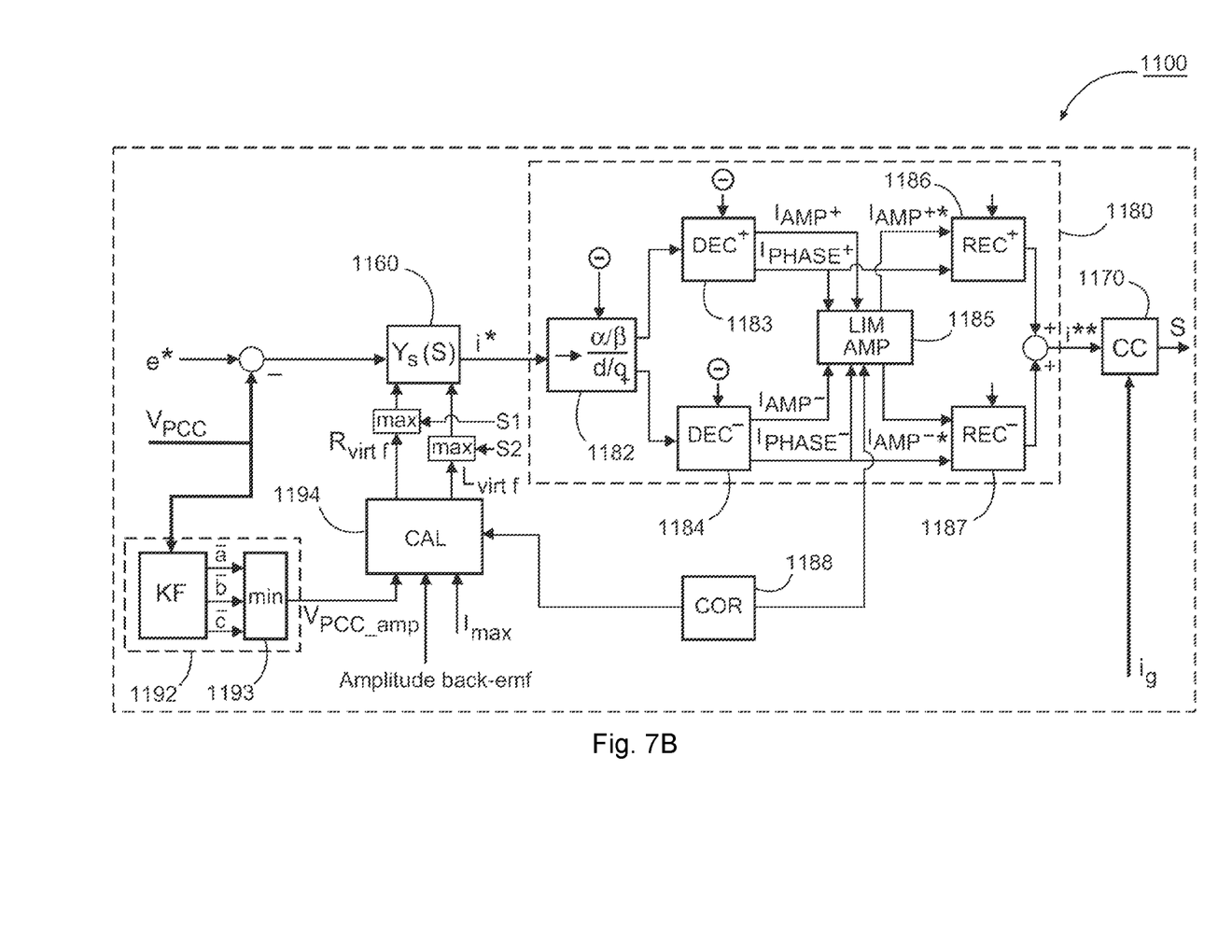
FIG. 7B shows a control circuit of a converter according to one preferred embodiment with a preferred current limiter, in particular for asymmetric network faults, comprising a correction.

FIG. 7B shows a further embodiment of a control circuit as shown in FIG. 7A.

The control circuit 1100 additionally comprises a correction 1188 which is disposed between the amplitude limiter 1185 and the admittance computer 1194, in particular in the form of a feedback loop.

The correction circuit 1188 comprises, for example, an amplitude determination circuit and a correction factor circuit.

Figure 7C:
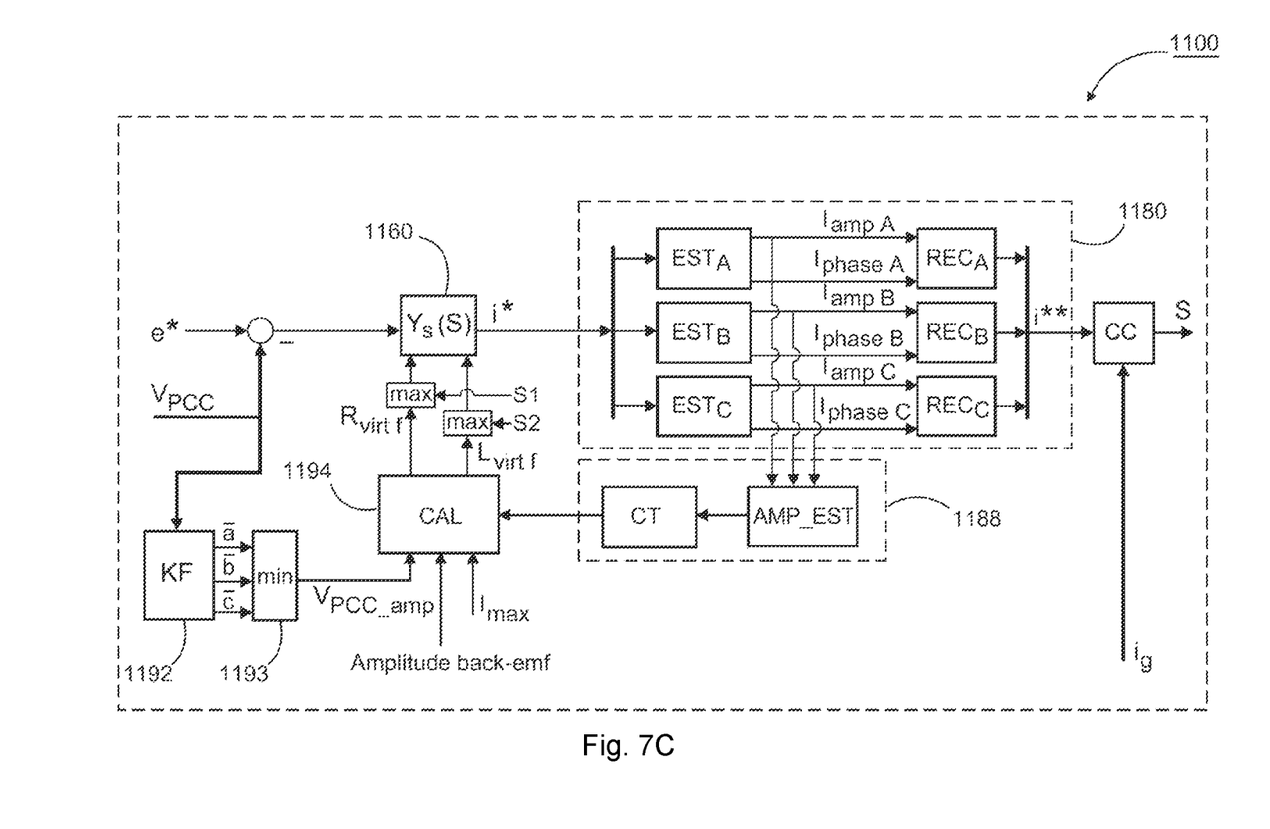
FIG. 7C shows a control circuit of a converter according to one preferred embodiment with a preferred current limiter, in particular for asymmetric network faults, comprising a correction in an alternative design.

A precise phase angle of the network voltage is advantageous since the virtual admittance is calculated on the basis of the amplitudes of the measured network voltage and the virtual back electromotive force, in particular in order to be able to limit the maximum current of the converter. The correction 1188 is provided for this purpose. If the amplitudes of the converter currents were still to exceed the maximum value following adjustment of the virtual admittance, the amplitude of the virtual admittance is corrected accordingly by means of the correction 1188, in particular in order to be able to limit the current setpoints below their maximum value. FIG. 7C shows a further embodiment of a control circuit as shown in FIG. 7A, in an alternative design.

The control circuit 1100 has the correction 1188 described in FIG. 7B which comprises an amplitude determination AMP_EST and a correction factor CT.

The current limiter 1180' has an alternative design to the current limiter 1180 in FIG. 7A.

The current limiter 1180' is configured by means of the three phase determinations $EST_A$, $EST_B$, $EST_C$ and the three reconstructions $REC_A$, $REC_B$, $REC_C$ to consider the current setpoints as single-phase currents. For this purpose, for example, the individual amplitudes and angles of the respective phases are estimated, in particular estimated by means of a Kalman filter, in order to calculate the final current setpoints of the converter.

The advantage compared with previous variants is that the resulting setpoints of the three-phase system do not have to be split into positive-sequence and negative-sequence system components.

FIG. 8 shows a control unit (controller) 1000 of a converter, in particular the inverter 110 as shown in FIG. 2, in one preferred embodiment.

The control unit comprises a control circuit 1100 described above or below, in particular comprising an internal control loop, an external control loop 1200 for generating an internal reference angle ⊖ and a virtual back electromotive force e* and a switching device 1300.

The control circuit 1100 is designed as described above or below and is configured to generate a control value S to control a converter, in particular depending on a virtual back electromotive force e*, an internal reference angle ⊖, a voltage $V_{PCC}$ measured at the connection point of the converter and a measured current $i_g$ generated by the converter.

The voltage $V_{PCC}$ at the connection point of the converter and the current $i_g$ generated by the converter are measured for this purpose, for example by means of the voltage measurement and/or current measurement described above or below.

For this purpose, the external control loop 1200 comprises a calculation unit (processor) 1210, an active power path 1220, a reactive power path 1230 and a computing unit (processor) 1240, wherein the active power path can also be referred to as the active power loop and the reactive power path can also be referred to as the reactive power loop. The external control loop 1200 therefore has two separate paths, i.e., one for the active power and one for the reactive power.

The calculation unit 1210 is configured to calculate an active power P and reactive power Q from the voltage $V_{PCC}$ measured at the connection point of the converter and the measured current $i_g$ generated by the converter.

The active power P serves as an input parameter for the active power path 1220.

The reactive power Q serves as an input parameter for the reactive power path 1230.

The active power path is configured to calculate an angular velocity ω and an internal reference angle ⊖ from an active power setpoint $P_{SET}$ which is predefined, for example, by a wind power installation control, and from the active power P calculated by the calculation unit 1210.

For this purpose, a reference generator torque T is first determined from the active power setpoint $P_{SET}$, for example by means of a first amplification (amplifier) 1221, and an actual generator torque $T_e$ is determined from the active power P calculated by the calculation unit 1210, for example by means of a second amplification (amplifier) 1222.

A differential angular velocity ω is determined from these two values $T_m$, $T_e$, taking into account a reference angular velocity $ω_{ref}$. The reference angular velocity can either be a fixed value (e.g., nominal frequency), or can be updated in operation, representing the value before the fault.

The internal reference angle ⊖ is then determined from the differential angular velocity ω using an amplification.

The internal reference angle ⊖ serves as an input parameter for the computing unit 1240.

The reactive power path 1230 is configured to determine a correlation parameter $M_f i_f$ from a reactive power setpoint $Q_{SET}$ which is predefined, for example, by means of a wind power installation control, and the reactive power Q calculated by the calculation unit 1210, in particular using a reference voltage $V_{ref}$. The correlation parameter $M_f i_f$ forms, in particular, the coupling between the stator and rotor.

Both the active power path 1220 and the reactive power path 1230 in each case have a switch S1, S2.

The switches S1 and S2 are tripped, for example, by the fault detection (detector) 1310.

The switch S1 is disposed within the active power path 1220 in such a way that, when the switch S1 is tripped, the active power path 1220 transfers only the reference angular velocity $\omega_{ref}$ and the internal reference angle $\Theta$ which has been determined from the reference angular velocity $\omega_{ref}$ to the computing unit 1240.

The switch S2 is disposed within the reactive power path 1230 in such a way that, when the switch S2 is tripped, the reactive power path 1230 transfers no further value to the computing unit 1240.

It is therefore proposed, in particular, that, in the event of a fault, the external control loop outputs a virtual back electromotive force e* having a constant amplitude, and preferably having a constant angle and a constant angular velocity.

The computing unit 1240 is further configured to calculate a virtual back electromotive force e* from a or the correlation parameter $M_f i_f$, in particular of the reactive power path 1230, an or the angular velocity $\omega$ and an or the internal reference angle $\Theta$.

The fault detection 1300 is configured to determine from the voltage $V_{PCC}$ measured at the connection point whether a fault event has occurred, for example an asymmetry in the network to which the converter is connected, and to determine corresponding switch signals SS1, SS2 therefrom, by means of which the switches S1, S2 are controlled.

It is therefore proposed particularly for the external control loop that, if a network fault occurs which has been detected, for example, by a fault detection 1300, the switches S1, S2 are changed in their position, in particular are opened, in such a way that a back electromotive force having a constant amplitude and a constant phase angle is thereby generated.

In other words, it is proposed that a constant back electromotive force is used in the event of a fault.

The internal control loop CR, in particular the control circuit 1100, can be used in order to limit virtual stator currents occurring as a result.

It is noted that the various techniques described herein may be performed by a controller, such as the controller 1000. Furthermore, the various element or components described herein may be part of the controller, such as the controller 1000, and the controller may perform the functions thereof.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A control circuit of a power converter of a wind power installation configured to control the power converter such that the power converter emulates a synchronous machine, comprising:
an internal control loop having a virtual admittance controller configured to provide a virtual admittance that is adjustable, wherein the control circuit causes the power converter to be controlled, based on the virtual admittance, to emulate the synchronous machine,
wherein the internal control loop includes an admittance adjustment circuit configured to modify the virtual admittance,
wherein the admittance adjustment circuit includes a comparator configured to:
receive a first variable for a resistive part of the virtual admittance that is adjustable or a second variable for an inductive part of the virtual admittance that is adjustable; and
compare the first variable with a determined value for the resistive part of the virtual admittance or compare the second variable with a determined value for the inductive part of the virtual admittance.

2. The control circuit as claimed in claim 1, wherein the virtual admittance is:

$$Y_s(S) = \frac{1}{Z_{virt}(S)} = \frac{1}{R_{virt} + sL_{virt}},$$

wherein $Z_{virt}$ is a virtual impedance, $R_{virt}$ is a corresponding resistive part of the virtual impedance, $L_{virt}$ is a corresponding inductive part of the virtual impedance and s is a Laplace operator.

3. The control circuit as claimed in claim 1, wherein the virtual admittance controller generates a first current setpoint.

4. The control circuit as claimed in claim 1, wherein the internal control loop includes:
a comparator configured to:
determine a difference between a virtual electromotive force and a voltage measured at a connection point of the power converter; and
output the difference to the virtual admittance controller.

5. The control circuit as claimed in claim 3, wherein the internal control loop includes:
a current comparator configured to generate a control value based on the first current setpoint and a current generated by the power converter.

6. The control circuit as claimed in claim 3, wherein the internal control loop includes:
a current limiter configured to perform a current amplitude limitation and limit the first current setpoint to a second current setpoint.

7. The control circuit as claimed in claim 6, wherein the current limiter includes:
a first transformer, that is a dq transformer or an $\alpha\beta$ transformer, configured to decompose the first current setpoint into an amplitude and an angle and output the amplitude to the current limiter; or
a second transformer configured to decompose the first current setpoint into a positive-sequence system component and a negative-sequence system component and output at least one of the positive-sequence system component and negative-sequence system component to the current limiter.

8. The control circuit as claimed in claim 6, wherein the current limiter includes:
a back transformer configured to transformation which is configured to provide the second current setpoint from the amplitude and an angle.

9. The control circuit as claimed in claim 6, wherein the current limiter includes:
an input configured to receive a frequency signal or an angle signal from an external control loop.

10. The control circuit as claimed in claim 6, wherein the current limiter includes:
a component splitter configured to split the amplitude or an angle into a positive-sequence system and into a negative-sequence system based on an internal reference angle.

11. The control circuit as claimed in claim 10, wherein the current limiter includes:
a component combiner configured to generate the second current setpoint from a positive-sequence system value or a negative-sequence system value of the amplitude or the angle.

12. The control circuit as claimed in claim 1, wherein the admittance adjustment circuit includes:
a filter configured to estimate a network voltage amplitude of a voltage measured at a connection point of the power converter; or
an integrator configured to estimate the network voltage amplitude.

13. The control circuit as claimed in claim 1, wherein the admittance adjustment circuit includes:
an admittance processor configured to determine the value for the resistive part of the virtual admittance or the value for the inductive part of the virtual admittance based on at least one of: a maximum permissible current, an estimated network voltage amplitude or an amplitude value.

14. A wind power installation comprising the control circuit as claimed in claim 1.

15. A method, comprising:
measuring a voltage at a connection point of the converter;
predefining a virtual electromotive force;
controlling a power converter of a wind power installation using the control circuit as claimed in claim 13 such that the power converter emulates a synchronous machine, the controlling comprising:
modifying the virtual admittance using the admittance adjustment circuit of the internal control loop;
determining a current control value based on the voltage measured at the connection point, the virtual electromotive force, and the modified virtual admittance; and
controlling the power converter based on the control value.

16. The method according to claim 15, comprising:
determining the current control value based on a current setpoint; and
limiting the current setpoint using a current limiter.

* * * * *